(12) United States Patent
Na et al.

(10) Patent No.: US 11,710,442 B2
(45) Date of Patent: Jul. 25, 2023

(54) GATE DRIVING CIRCUIT AND DISPLAY DEVICE INCLUDING THE SAME

(71) Applicant: Samsung Display Co., Ltd., Yongin-si (KR)

(72) Inventors: Junhong Na, Anyang-si (KR); Kangnam Kim, Seoul (KR); Sung-Hoon Lim, Suwon-si (KR); Woogeun Lee, Suwon-si (KR); Kyu-Sik Cho, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/481,591

(22) Filed: Sep. 22, 2021

(65) Prior Publication Data

US 2022/0101775 A1 Mar. 31, 2022

(30) Foreign Application Priority Data

Sep. 25, 2020 (KR) ........................ 10-2020-0125228

(51) Int. Cl.
*G09G 3/20* (2006.01)

(52) U.S. Cl.
CPC ... *G09G 3/2092* (2013.01); *G09G 2310/0275* (2013.01)

(58) Field of Classification Search
CPC ......... G09G 3/2092; G09G 2310/0275; G09G 2300/0426; G09G 2310/0286; G09G 2310/08; G09G 3/3266; G09G 2310/0267; G11C 19/28
See application file for complete search history.

(56) References Cited

U.S. PATENT DOCUMENTS

| 8,395,157 | B2 | 3/2013 | Park et al. |
| 8,803,865 | B2 | 8/2014 | Lim et al. |
| 9,218,790 | B2 | 12/2015 | Lim et al. |
| 9,671,658 | B2 | 6/2017 | Lim et al. |
| 10,950,678 | B2 | 3/2021 | Kim et al. |

(Continued)

FOREIGN PATENT DOCUMENTS

| KR | 10-2017-0045428 | 4/2017 |
| KR | 10-2018-0008957 | 1/2018 |

(Continued)

*Primary Examiner* — Jose R Soto Lopez
(74) *Attorney, Agent, or Firm* — H.C. Park & Associates, PLC

(57) ABSTRACT

A gate driving circuit includes a plurality of unit stages connected to each other, wherein each of the plurality of unit stages includes a first transistor having a lower gate electrode, an upper gate electrode disposed on the lower gate electrode, an active layer disposed between the lower gate electrode and the upper gate electrode, a first electrode contacting a first portion of the active layer, and a second electrode contacting a second portion of the active layer, a first capacitor defined by a first region in which the lower gate electrode and the upper gate electrode overlap, and a second capacitor defined by a second region in which the upper gate electrode and the first electrode overlap, wherein the upper gate electrode and the lower gate electrode are electrically coupled to each other in the first region where the upper gate electrode and the lower gate electrode overlap to form the first capacitor.

18 Claims, 13 Drawing Sheets

(56) References Cited

U.S. PATENT DOCUMENTS

| | | | | |
|---|---|---|---|---|
| 2008/0266216 A1* | 10/2008 | Choi | ................... | G09G 3/3258 |
| | | | | 345/76 |
| 2011/0150169 A1* | 6/2011 | Lin | ................... | G11C 19/28 |
| | | | | 377/64 |
| 2013/0028370 A1* | 1/2013 | Kikuchi | ............... | G09G 3/3677 |
| | | | | 377/64 |
| 2013/0039455 A1* | 2/2013 | Horiuchi | ............. | G09G 3/3677 |
| | | | | 377/64 |
| 2016/0125829 A1 | 5/2016 | Jeon et al. | | |
| 2016/0225307 A1* | 8/2016 | Yoon | ................... | G09G 3/2092 |
| 2017/0061911 A1* | 3/2017 | Lin | ................... | G09G 3/3655 |
| 2017/0110528 A1 | 4/2017 | Kim et al. | | |
| 2017/0337875 A1* | 11/2017 | Jeon | ................... | G09G 3/3291 |
| 2018/0018920 A1 | 1/2018 | Kim et al. | | |
| 2018/0166585 A1* | 6/2018 | Takechi | ............ | H01L 29/78648 |
| 2018/0167070 A1 | 6/2018 | Kim | | |
| 2020/0043958 A1* | 2/2020 | Horiuchi | ................ | H01L 27/06 |
| 2020/0294458 A1* | 9/2020 | Iwasa | ................ | G09G 3/3685 |
| 2022/0037434 A1* | 2/2022 | Huang | ................ | H10K 59/124 |
| 2022/0093027 A1* | 3/2022 | Hong | ................... | G11C 19/28 |
| 2022/0093028 A1* | 3/2022 | Hong | ................... | G11C 19/28 |

FOREIGN PATENT DOCUMENTS

| | | |
|---|---|---|
| KR | 10-1859711 | 5/2018 |
| KR | 10-2018-0067948 | 6/2018 |

* cited by examiner

GATE DRIVING CIRCUIT AND DISPLAY DEVICE INCLUDING THE SAME

CROSS-REFERENCE TO RELATED APPLICATION

This application claims priority from and the benefit of Korean Patent Application No. 10-2020-0125228, filed on Sep. 25, 2020, which is incorporated by reference for all purposes as if fully set forth herein.

BACKGROUND

Field

Embodiments described herein relate to a gate driving circuit and, more particularly, to a display device including the same.

Discussion of the Background

A display device includes a display area and a non-display area. A plurality of pixels, a plurality of gate lines, and a plurality of data lines may be formed in the display area. A gate driving circuit may be formed in the non-display area. The gate driving circuit may transmit a gate signal to the plurality of gate lines. The plurality of pixels may emit light by receiving a data voltage under control of the gate signal.

To reduce the area of the gate driving circuit and increase an area of the display area, a double gate transistor may be used in the gate driving circuit. When using the double gate transistor, a contact part for electrically connecting an upper gate and a lower gate may be required.

The above information disclosed in this Background section is only for understanding of the background of the inventive concepts, and, therefore, it may contain information that does not constitute prior art.

SUMMARY

Applicant realized that when using the double gate transistor, the area of the gate driving circuit may be increased due to the contact part. There is a need to reduce the area of the gate driving circuit when using a double gate transistor in the gate driving circuit of a display device.

Gate driving circuits constructed according to the principles and illustrative implementations of the invention, and display device including the same, are capable of reducing the area of the gate driving circuit and thereby increasing the display area usable to display images. For example, the gate driving circuit may use a dual gate transistor that does not require a contact part for connecting an upper gate electrode to a lower gate electrode of the gate driving circuit. As such, the gate driving circuit may have a smaller size and the display device having the gate driving circuit may have a smaller non-display area compared to conventional gate driving circuits and display devices.

A gate driving circuit for a display device according to an embodiment may include a plurality of unit stages connected to each other, wherein each of the plurality of unit stages includes a first transistor comprising a lower gate electrode, an upper gate electrode disposed on the lower gate electrode, an active layer disposed between the lower gate electrode and the upper gate electrode, a first electrode contacting a first portion of the active layer, and a second electrode contacting a second portion of the active layer; a first capacitor defined by a first region where the lower gate electrode and the upper gate electrode overlap; and a second capacitor defined by a second region where the upper gate electrode and the first electrode overlap, wherein the upper gate electrode and the lower gate electrode are electrically coupled to each other in the first region where the upper gate electrode and the lower gate electrode overlap to form the first capacitor.

The first transistor may be an NMOS transistor.

When a voltage at the upper gate electrode is a gate high voltage and a voltage at the second electrode changes from a gate low voltage to the gate high voltage, the second capacitor may bootstrap the voltage at the upper gate electrode and a voltage at the first electrode.

The first transistor may be a PMOS transistor.

When a voltage at the upper gate electrode is a gate low voltage and a voltage at the second electrode changes from a gate high voltage to the gate low voltage, the second capacitor may bootstrap the voltage at the upper gate electrode and a voltage at the first electrode.

The lower gate electrode and the upper gate electrode may overlap each other in the first region.

The active layer may include an opening overlapping the upper gate electrode.

The first transistor may include a lower gate insulating layer disposed between the lower gate electrode and the active layer, a first insulating layer disposed between the lower gate insulating layer and the upper gate electrode and covering the active layer, and an upper gate insulating layer disposed on the first insulating layer and covering the upper gate electrode.

Each of the plurality of the unit stages may include a second transistor operable in response to a previous output signal from a previous unit stage, third transistor to discharge the second capacitor in response to next output signal from a next unit stage and a fourth transistor to discharge a current output signal in response to the next output signal.

The plurality of unit stages may be connected to each other such that an output of a corresponding one of the plurality of unit stages is connected to an input of another of the plurality of unit stages that is adjacently positioned with respect to the corresponding one of the plurality of unit stages, and such that an output of the another of the plurality of unit stages is connected to an input of the corresponding one of the plurality of unit stages.

A display device according to an embodiment may include a substrate comprising a display area and a non-display area, plurality of pixels formed in the display area, and a gate driving circuit formed in the non-display area, wherein the gate driving circuit includes a plurality of unit stages subordinately connected to each other, wherein each of the plurality of unit stages include a first transistor comprising a lower gate electrode, an upper gate electrode disposed on the lower gate electrode, an active layer disposed between the lower gate electrode and the upper gate electrode, a first electrode contacting a first portion of the active layer, and a second electrode contacting a second portion of the active layer; a first capacitor defined by the lower gate electrode and the upper gate electrode; and a second capacitor defined by the upper gate electrode and the first electrode, wherein the upper gate electrode and the lower gate electrode are electrically coupled to each other in the first region where the upper gate electrode and the lower gate electrode overlap to form the first capacitor.

The first transistor may be an NMOS transistor.

When a voltage at the upper gate electrode is a gate high voltage and a voltage at the second electrode changes from a gate low voltage to the gate high voltage, the second capacitor may bootstrap the voltage at the upper gate electrode and a voltage at the first electrode.

The first transistor may be a PMOS transistor.

When a voltage at the upper gate electrode is a gate low voltage and a voltage at the second electrode changes from a gate high voltage to the gate low voltage, the second capacitor may bootstrap the voltage at the upper gate electrode and a voltage at the first electrode.

The lower gate electrode and the upper gate electrode may overlap each other in the first region.

The active layer may include an opening overlapping the upper gate electrode.

The first transistor may include a lower gate insulating layer disposed between the lower gate electrode and the active layer, a first insulating layer disposed between the lower gate insulating layer and the upper gate electrode and covering the active layer and an upper gate insulating layer disposed on the first insulating layer and covering the upper gate electrode.

Each of the plurality of the unit stages may include a second transistor operable in response to a previous output signal from a previous unit stage, a third transistor to discharge the second capacitor in response to next output signal from a next unit stage and a fourth transistor to discharge a current output signal in response to the next output signal.

The lower gate electrode and the upper gate electrode of the first transistor of the gate driving circuit may be electrically coupled by the first capacitor.

Accordingly, an area of the gate driving circuit may be reduced by removing a contact part electrically connecting the lower gate electrode and the upper gate electrode.

The first transistor may be a double gate transistor having the upper gate electrode and the lower gate electrode. The double gate transistor may have a relatively large area of the gate electrode overlapping the active layer. Accordingly, a capacitance of the first transistor may be greater than a capacitance of a single transistor having only the upper gate electrode or only the lower gate electrode. Accordingly, even if an area of the first transistor is smaller than an area of the single gate transistor, the capacitance of the first transistor may be equal to or greater than the capacitance of the single transistor.

The display device according to embodiments may include the gate driving circuit having a small area, and thus, an area of a non-display area of the display device may be reduced.

It is to be understood that both the foregoing general description and the following detailed description are exemplary illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary illustrative embodiments of the invention, and together with the description serve to explain the inventive concepts.

DETAILED DESCRIPTION

Figure 1:
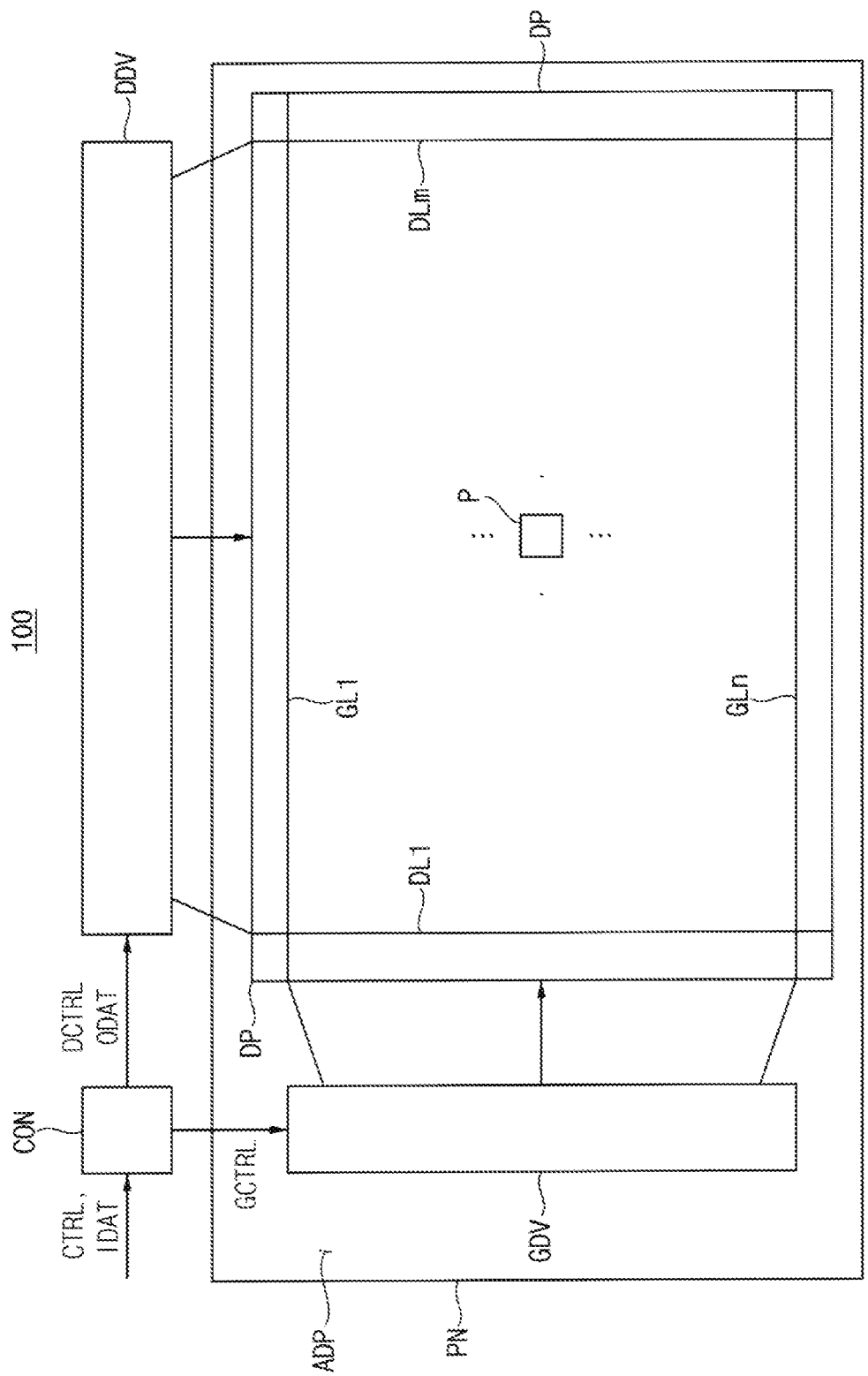
FIG. 1 is a block diagram illustrating an embodiment of a display device constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or is more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or is "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements is described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these is regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a block diagram illustrating a display device according to an embodiment that is constructed according to principles of the invention.

Referring to FIG. 1, a display device 100 may include a display panel PN, a gate driving circuit GDV, a data driving circuit DDV, and a timing controller CON. The display panel PN may include a display area DP and a non-display area ADP. The gate driving circuit GDV, the data driving circuit DDV, and the timing controller CON may be disposed in the non-display area ADP.

A plurality of gate lines GL1 to GLn, a plurality of data lines DL1 to DLm, and a plurality of pixels P may be disposed in the display area DP. The plurality of gate lines GL1 to GLn may cross the plurality of data lines DL1 to DLm and be insulated from each other. The plurality of pixels P may be electrically connected to the plurality of gate lines GL1 to GLn and the plurality of data lines DL1 to DLm. Each of the plurality of pixels P may include a light emitting diode. In the display area DP, the light emitting diode may display an image. For example, the light emitting diode may include an organic light emitting diode (OLED), a quantum-dot organic light emitting diode (QDOLED), and a quantum-dot nano light emitting diode, etc.

The timing controller CON may generate a gate control signal GCTRL, a data control signal DCTRL, and an output image data ODAT based on a control signal CTRL and an input image data IDAT. For example, the control signal CTRL may include a vertical synchronization signal, a horizontal synchronization signal, an input data enable signal, a master clock signal, etc. For example, the input image data IDAT may be a RGB data including red image data, green image data, and blue image data. Alternatively, the input image data IDAT may include magenta image data, cyan image data, and yellow image data.

The gate driving circuit GDV may generate gate signals based on the gate control signal GCTRL provided from the timing controller CON. For example, the gate control signal GCTRL may include a vertical start signal, a clock signal, a gate off signal, etc.

The gate driving circuit GDV may be electrically connected to the pixels P through the plurality of gate lines GL1 to GLn and may sequentially output the gate signals. Each of the pixels P may receive a data voltage according to the control of each of the gate signals.

The data driving circuit DDV may generate the data voltage based on the data control signal DCTRL and the output image data ODAT provided from the timing controller CON. For example, the data control signal DCTRL may include an output data enable signal, a horizontal start signal, and a load signal.

The data driving circuit DDV may be electrically connected to the pixels P through the plurality of data lines DL1 to DLm and may generate the data voltages. Each of the pixels P may display an image by receiving a signal for luminance corresponding to each of the data voltages.

Figure 2:
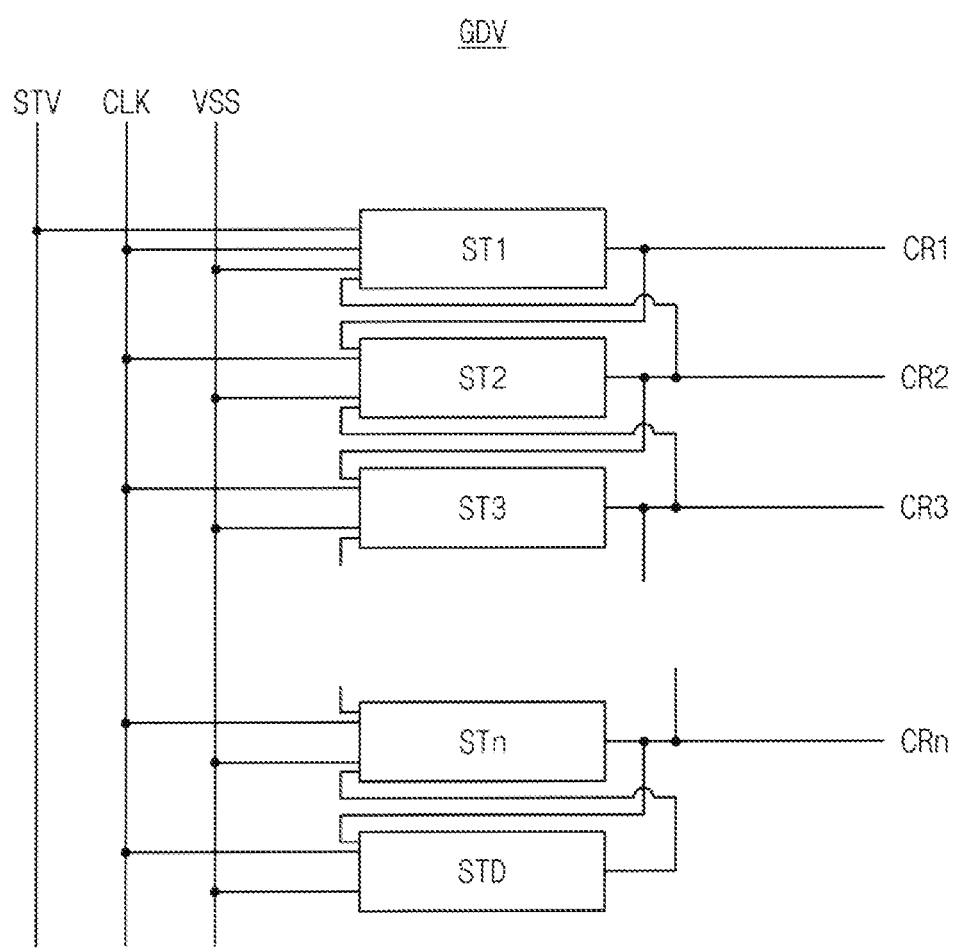
FIG. 2 is a block diagram of a gate driving circuit shown in FIG. 1.

FIG. 2 is a block diagram of the gate driving circuit shown in FIG. 1.

Referring to FIG. 2, the gate driving circuit GDV may be one shift register. The is shift register may include a plurality of unit stages ST1 to STn and a dummy stage STD. The dummy stage STD may not be connected to the gate lines GL1 to GLn. Each of the plurality of unit stages ST1 to STn may be subordinately connected in the following manner: an output of ST1 is provided as an input to ST2 and an output of ST2 is provided as an input to ST1, the output of ST2 is provided as an input to ST3 and an output of ST3 is provided as an input to ST2, etc. Each of the plurality of unit stages may sequentially output output signals CR1 to CRn to corresponding gate lines GL1 to GLn. Each of the unit stages ST1 to STn may receive the gate control signal GCTRL from the timing controller CON. The gate control signal GCTRL may include a vertical start signal and at least one clock signal. For example, the gate control signal GCTRL may include a vertical start signal STV, a clock signal CLK, and a gate off signal VSS.

The first unit stage ST1 may receive the vertical start signal STV, the clock signal CLK, the gate-off signal VSS, and the second output signal CR2 output from the second unit stage ST2. The first unit stage ST1 may output the first output signal CR1 to the first gate line GL1. In this case, the first output signal CR1 may be a clock signal CLK.

Each of the second unit stage ST2 to the $n^{th}$ unit stage STn may receive the output signal from the previous unit stage, the output signal from the next unit stage, the clock signal CLK, and the gate-off signal VSS. For example, the second unit stage ST2 may receive the first output signal CR1 output from the first unit stage ST1, the third output signal CR3 output from the third unit stage ST3, and the clock signal CLK, and the gate-off signal VSS. The second unit stage ST2 may output the second output signal CR2 to the second gate line GL2. In this case, the second output signal CR2 may be the clock signal CLK.

Figure 3:
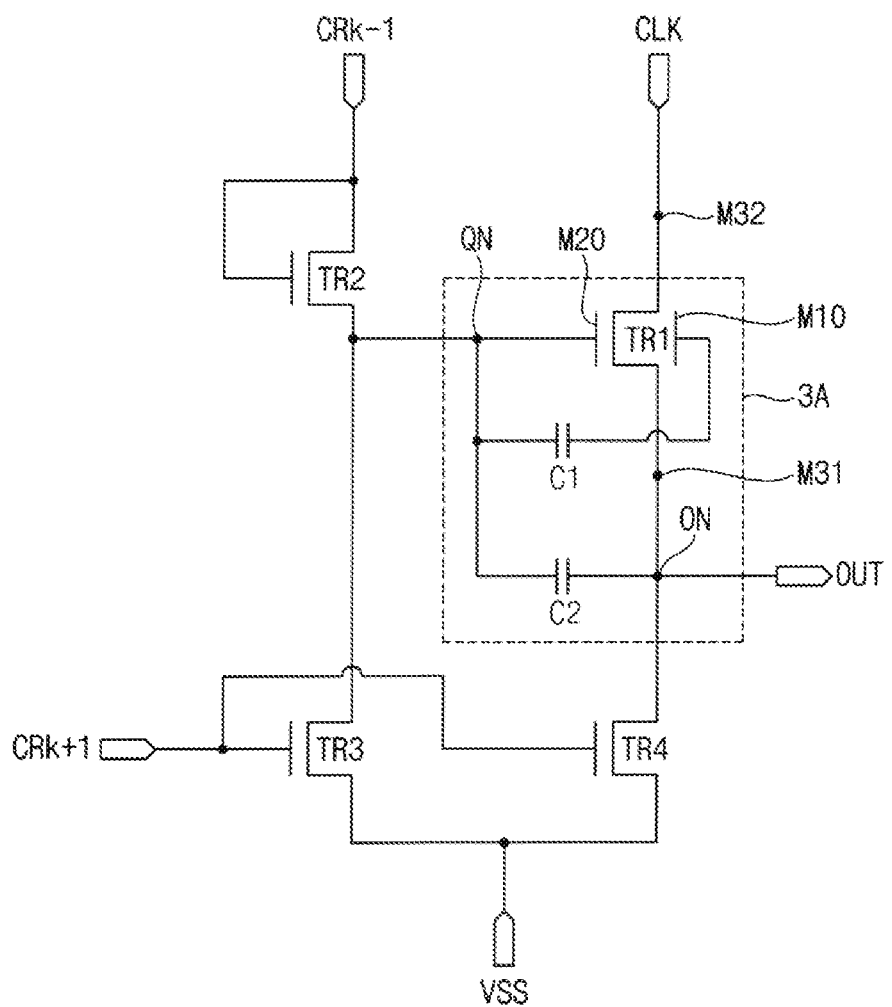
FIG. 3 is a circuit diagram of a $k^{th}$ unit stage among a plurality of unit stages in FIG. 2.

FIG. 3 is a circuit diagram of a $k^{th}$ unit stage among the plurality of unit stages of FIG. 2.

Referring to FIG. 3, the $k^{th}$ unit stage STk may include at least a first transistor TR1, a first capacitor C1, and a second capacitor C2. For example, the $k^{th}$ unit stage STk may include the first capacitor C1, the second capacitor C2, the first transistor TR1, a second transistor TR2, a third transistor TR3, and a fourth transistor TR4.

The first transistor TR1 may include a lower gate electrode M10, an upper gate electrode M20 connected to a Q node QN, a second electrode M32 where the clock signal CLK is input, and a first electrode M31 connected to an output node ON. The lower gate electrode M10 and the upper gate electrode M20 may be electrically coupled by the first capacitor C1. The second capacitor C2 may be defined by the upper gate electrode M20 and the first electrode M31. Detailed structure of the first transistor TR1, the first capacitor C1, and the second capacitor C2 will be described later with reference to FIG. 8.

When the first transistor TR1 is an NMOS, the second electrode M32 may be a drain electrode, and the first electrode M31 may be a source electrode. When the first transistor TR1 is a PMOS, the second electrode M32 may be a source electrode and the first electrode M31 may be a drain electrode. Hereinafter, only the case where the first transistor TR1 is an NMOS will be described, but the first transistor TR1 may alternatively be a PMOS. A person skilled in the art will be able to clearly understand the case where the first transistor is a PMOS.

A drain electrode and a gate electrode of the second transistor TR2 may receive the output signal CRk−1 of the $k-1^{th}$ unit stage. The source electrode of the second transistor TR2 may be connected to a drain electrode of the third transistor TR3.

A gate electrode of the third transistor TR3 may receive the output signal CRk+1 of the $k+1^{th}$ unit stage. The drain electrode of the third transistor TR3 may receive the gate-off signal VSS.

A gate electrode of the fourth transistor TR4 may receive the output signal CRk+1 of the $k+1^{th}$ unit stage. A drain electrode of the fourth transistor TR4 may receive the gate-off signal VSS. A source electrode of the fourth transistor TR4 may be connected to the output node ON.

Figure 4:
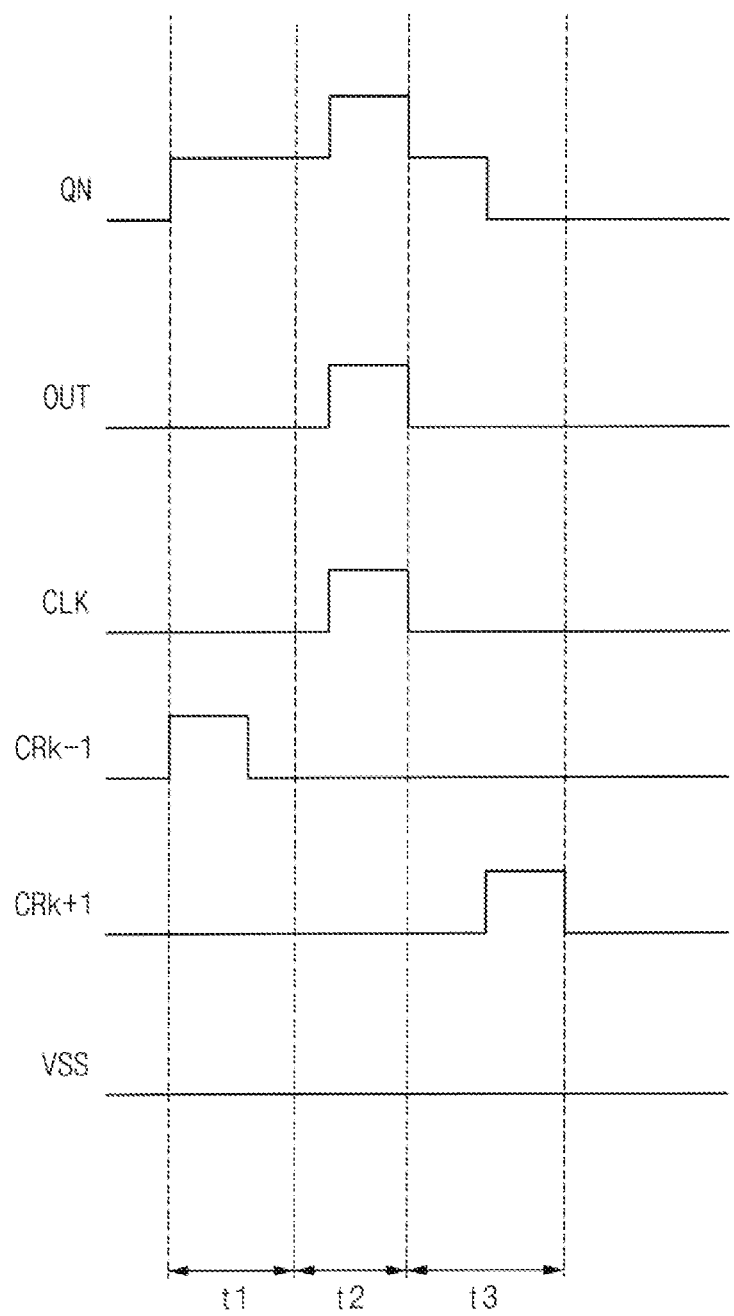
FIG. 4 is a waveform diagram showing a potential of a Q node and an output signal shown in FIG. 3.

FIG. 4 is a waveform diagram showing a potential of the Q node and the output signal shown in FIG. 3.

Referring to FIG. 4, the clock signal CLK, the output signal CRk−1 of the $k-1^{th}$ unit stage, the output signal CRk+1 of the $k+1^{th}$ unit stage, and the gate-off signal VSS may be gate high voltage VGH or a gate low voltage VGL. When the first transistor TR1 is an NMOS, when the gate high voltage VGH is applied to the upper gate electrode M20 and the lower gate electrode M10, the first transistor TR1 is turned on. When the first transistor TR1 is a PMOS, when the gate low voltage VGL is applied to the upper gate electrode M20 and the lower gate electrode M10, the first transistor is turned on. Hereinafter, only the case where the first transistor TR1 is an NMOS will be described, but the first transistor TR1 may alternatively be a PMOS. A person skilled in the art will be able to clearly understand the case where the first transistor is a PMOS.

In a first period t1, the $k-1^{th}$ output signal CRk−1 is input as the gate high voltage to the $k^{th}$ stage STk, and the clock signal CLK, the $k+1^{th}$ output signal CRk+1, and the gate-off signal VSS are input as the gate low voltage.

In a second period t2, the clock signal CLK is input to the $k^{th}$ unit stage STk as the gate high voltage, and the $k-1^{th}$ output signal CRk−1 and the $k+1^{th}$ output signal CRk+1, and the gate-off signal VSS are input as the gate low voltage.

In a third period t3, the $k+1^{th}$ output signal CRk+1 is input as the gate high voltage to the $k^{th}$ unit stage STk, and the $k-1^{th}$ output signal CRk−1, the clock signal CLK, the gate-off is signal VSS are input as the gate low voltage.

Figure 5:
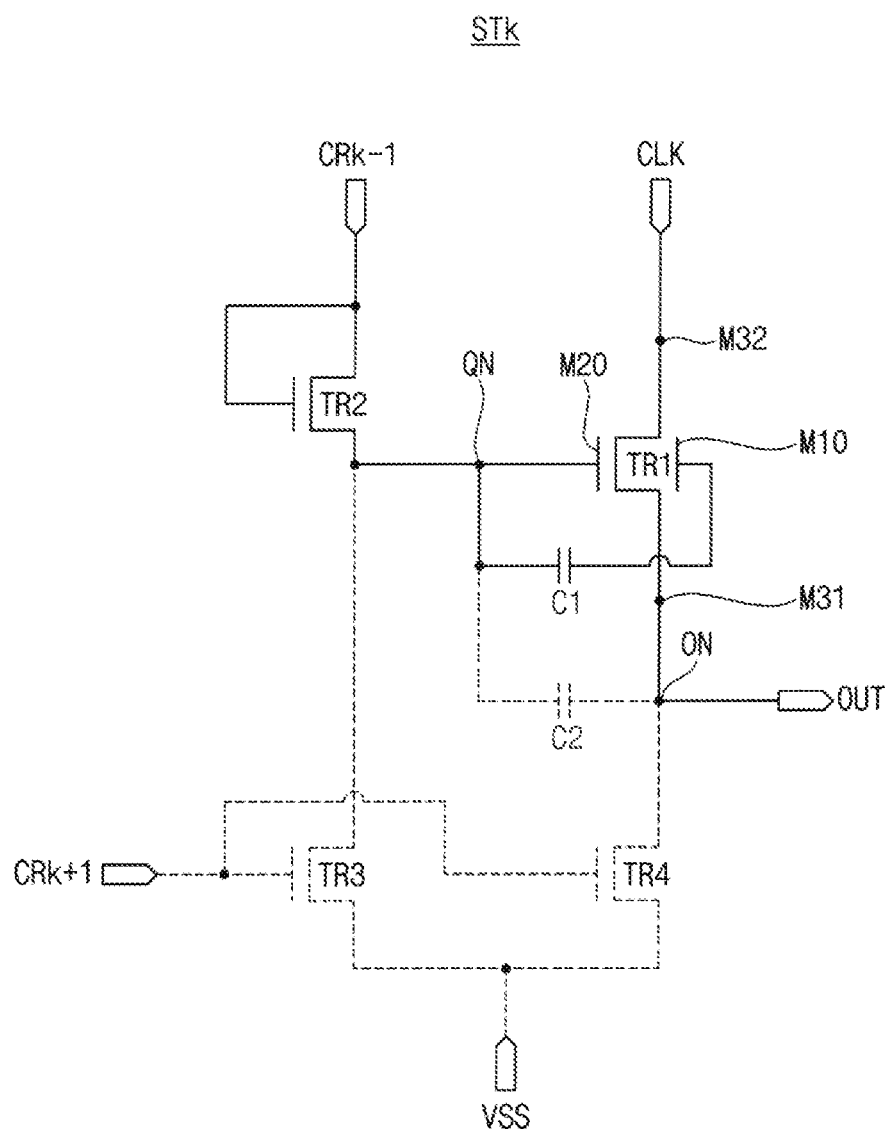
FIG. 5, FIG. 6, and FIG. 7 are circuit diagrams illustrating a signal flow according to the waveform diagram in FIG. 4.
Figure 6:
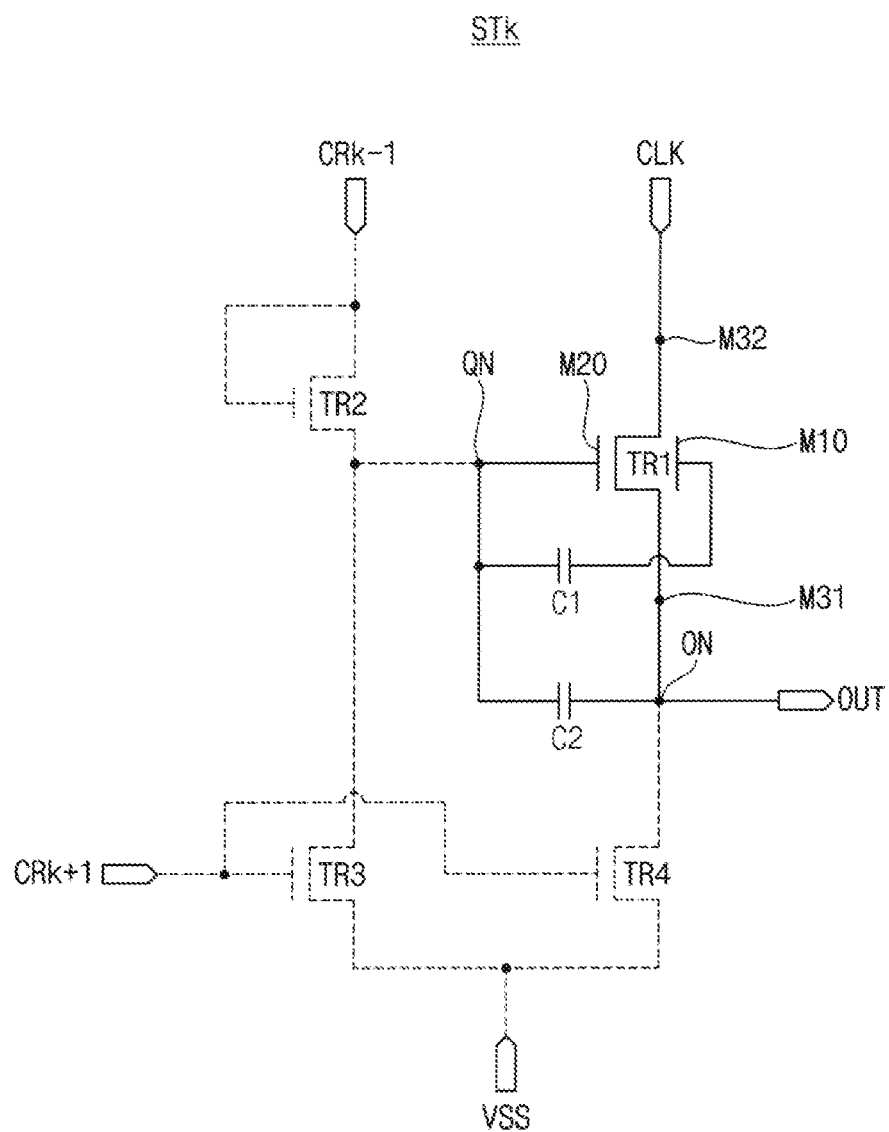
Figure 7:
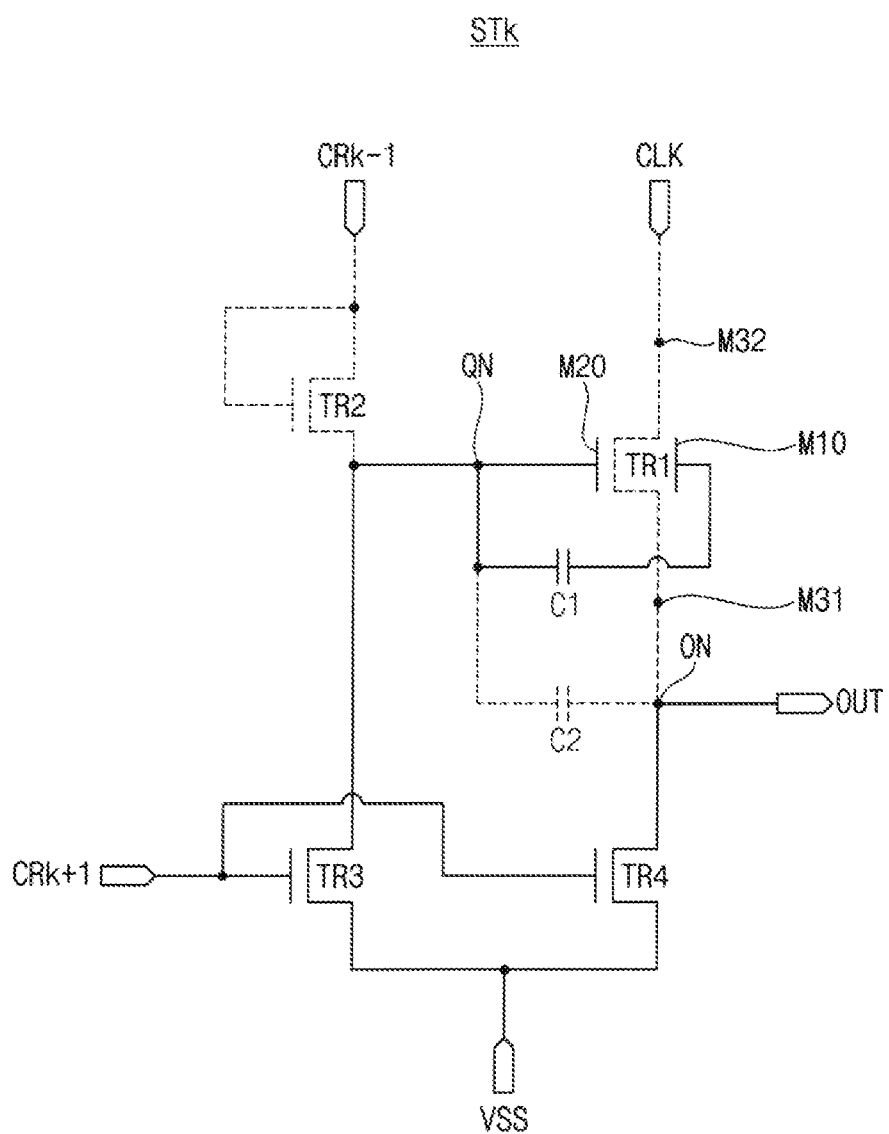

FIGS. 5, 6, and 7 are circuit diagrams illustrating a signal flow according to the waveform diagram of FIG. 4.

Referring to FIG. 4 and FIG. 5, as the $k-1^{th}$ output signal CRk−1 is input to the $k^{th}$ unit stage STk as a pulse having a gate high voltage in the first period t1, the second transistor TR2 may be turned on. Accordingly, the $k-1^{th}$ output signal CRk−1 may be supplied to the Q node QN through the turned-on second transistor TR2. When the Q node QN is supplied with the $k-1^{th}$ output signal CRk−1, a voltage of the Q node QN may increase. Accordingly, a voltage of the upper gate electrode M20 connected to the Q node QN and a voltage of the lower gate electrode M10 electrically coupled to the upper gate electrode M20 by the first capacitor C1 may increase. Accordingly, the first transistor TR1 may be turned on. The turned-on first transistor TR1 may output a clock signal CLK input as a gate low voltage to the output node ON.

Referring to FIG. 4 and FIG. 6, the Q node QN may have a voltage high enough to turn on the first transistor TR1 in the second period t2. Accordingly, the first transistor TR1 may be turned on. As the first transistor TR1 is turned on, the clock signal CLK supplied to the second electrode M32 of the first transistor TR1 may be output to the output node ON.

As the clock signal CLK changes from the gate low voltage to the gate high voltage in the second period t2, the second capacitor C2 may bootstrap a voltage at the Q node QN and a voltage at the output node ON connected to the first electrode M31. Specifically, when a pulse having the gate high voltage of the clock signal CLK is supplied to the output node ON, the voltage at the Q node QN also increases due to coupling of the second capacitor C2. Accordingly, as the voltage at the upper gate electrode M20 and the lower gate electrode M10 of the first transistor TR1 and the voltage at the first electrode M31 are bootstrapped, voltage between the upper gate is electrode M20, the lower gate electrode M10 and the first electrode M31 may be kept constant. Accordingly, the first transistor TR1 may maintain a turned-on state.

Referring to FIG. 4 and FIG. 7, in the third period t3, as the k+1$^{th}$ output signal CRk+1 is input as a pulse having a gate high voltage, the third transistor TR3 and the fourth transistor TR4 may be turned on. Accordingly, the gate-off signal VSS having the gate low voltage may be supplied to the Q node QN and the output node ON. Accordingly, the voltage of the Q node QN drops, and the voltage of the upper gate electrode M20 connected to the Q node and the voltage of the lower gate electrode M10 electrically coupled by the upper gate electrode M20 and the first capacitor C1 may drop. As the voltage of the upper gate electrode M20 and the voltage of the lower gate electrode M10 drop, the first transistor TR1 may be turned off. Also, the gate-off signal VSS may be supplied to the output node ON through the turned-on fourth transistor TR4.

Figure 8:
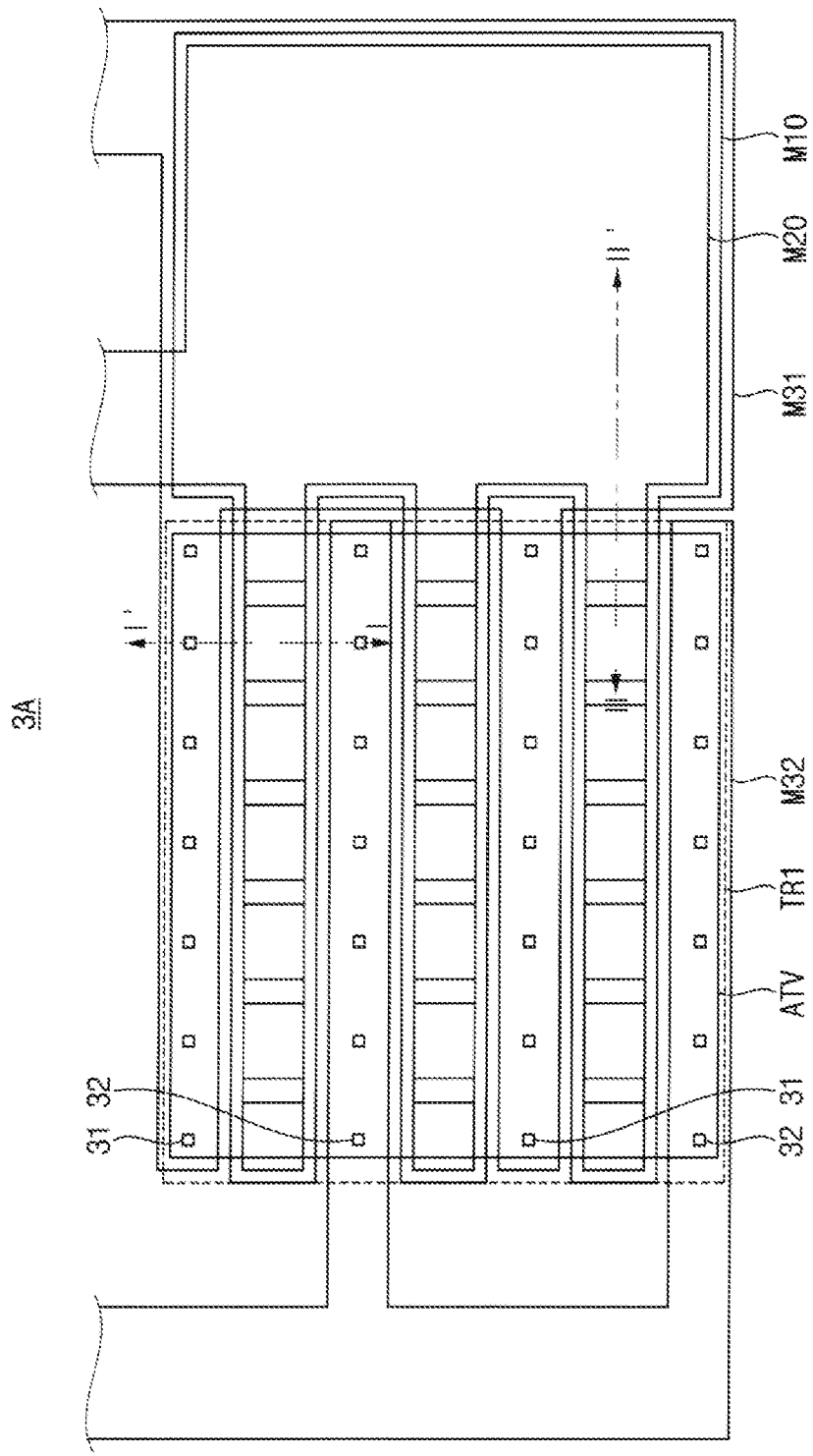
FIG. 8 is a plan view illustrating a portion of an embodiment of a gate driving circuit constructed according to principles of the invention.

FIG. 8 is a plan view illustrating a portion of an embodiment of the gate driving circuit constructed according to principles of the invention. FIGS. 9, 10, 11, and 12 are layout diagrams illustrating embodiments of a portion of the gate driving circuit.

Referring to FIG. 8, the first transistor TR1 may include a lower gate electrode M10, an upper gate electrode M20, an active layer ATV, a first electrode M31, and a second electrode M32. The upper gate electrode M20 may be disposed on the lower gate electrode M10 and may be connected to the Q node QN. The active layer ATV may be disposed between the lower gate electrode M10 and the upper gate electrode M20. The first electrode M31 is connected to the output node ON and may contact the first portion 31 of the active layer ATV. The second electrode M32 contacts the second portion 32 of the active layer ATV and may receive a clock signal CLK.

When the first transistor TR1 is an NMOS, when the gate high voltage is applied to is the upper gate electrode M20 and the lower gate electrode M10, the first transistor TR1 may be turned on. When the first transistor TR1 is turned on, the clock signal CLK input to the second electrode M32 may be output to the output node ON through the active layer ATV and the first electrode M31.

When the first transistor TR1 is a PMOS, when the gate low voltage is applied to the upper gate electrode M20 and the lower gate electrode M10, the first transistor TR1 may be turned on. When the first transistor TR1 is turned on, the clock signal CLK input to the second electrode M32 may be output to the output node ON through the active layer ATV and the first electrode M31.

The capacitance of the first transistor TR1 having the upper gate electrode M20 and the lower gate electrode M10 may be larger than the capacitance of a single transistor having only the upper gate electrode M20 or only the lower gate electrode M10. Accordingly, even if the area of the first transistor TR1 is smaller than the area of the single gate transistor, the capacitance of the first transistor TR1 may be equal to or greater than the capacitance of the single transistor.

Figure 11:
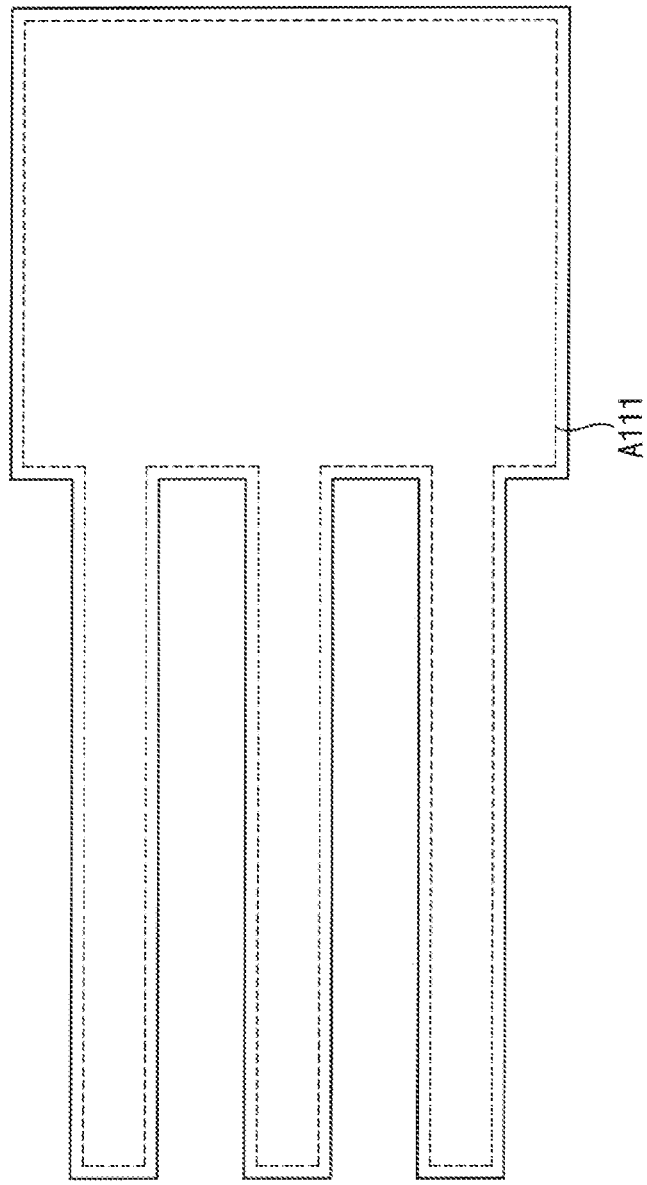

The first capacitor C1 may be defined as a region where the lower gate electrode M10 and the upper gate electrode M20 overlap (A1110 of FIG. 11). Accordingly, the area of the gate driving circuit GDV may be reduced compared to the case where the first capacitor C1 is formed separately from the first transistor TR1. In addition, since the first capacitor C1 electrically couples the lower gate electrode M10 and the upper gate electrode M20, the first transistor TR1 may not include a contact part for electrically connecting the lower gate electrode M10 and the upper gate electrode M20. Accordingly, the area of the gate driving circuit GDV can be reduced by the amount corresponding to the area of the contact part.

Figure 10:
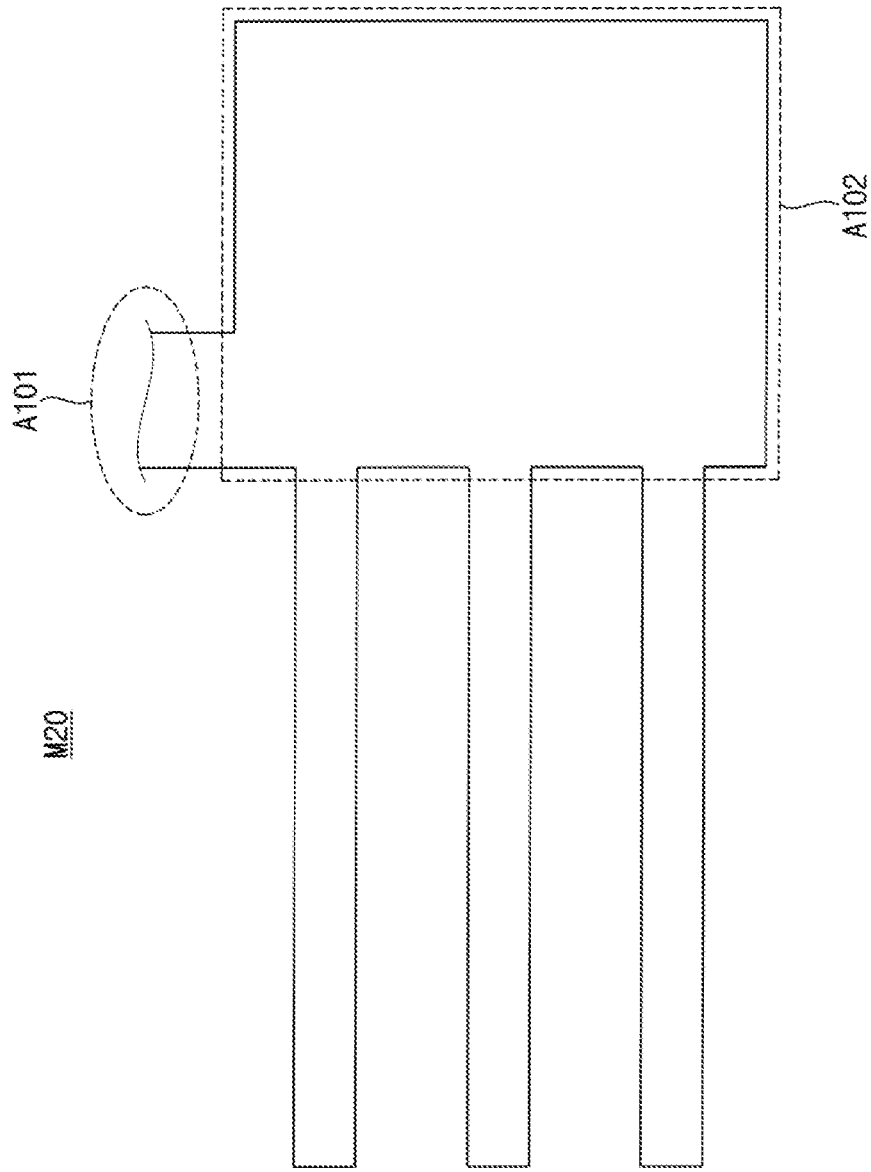

The second capacitor C2 may be defined as a region where the upper gate electrode is M20 and the first electrode M31 overlap (A102 of FIG. 10). Accordingly, the area of the gate driving circuit GDV can be reduced compared to the case where the second capacitor C2 is formed separately from the first transistor TR1. The first electrode M31 may be formed by being stacked on the upper gate electrode M20. Accordingly, the area of the gate driving circuit GDV may be further reduced.

Figure 9:
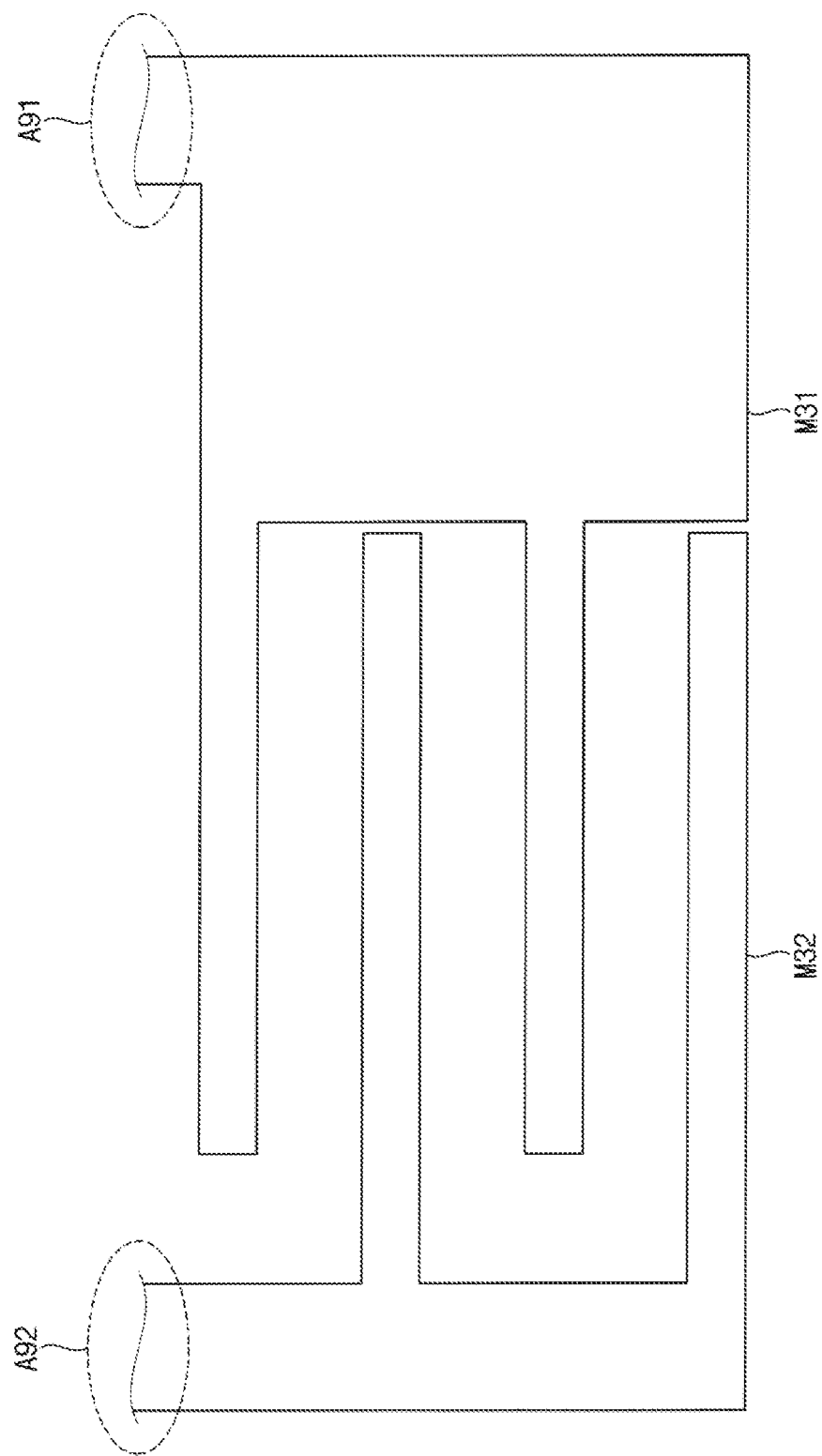
FIG. 9, FIG. 10, FIG. 11, and FIG. 12 are layout diagrams illustrating embodiments of a portion of a gate driving circuit.

Referring to FIG. 9, the first electrode M31 may be connected to the output node ON through a first connection part A91. The second electrode M32 may receive the clock signal CLK through a second connection part A92.

Referring to FIG. 10, the upper gate electrode M20 may be connected to the Q node QN through a third connection part A101. The second capacitor C2 may be defined as a region A102 where the upper gate electrode M20 and the first electrode M31 overlap.

Referring to FIG. 11, the first capacitor C1 may be defined as a region A111 where the lower gate electrode M10 and the upper gate electrode M20 overlap.

The first electrode M31, the second electrode M32, the upper gate electrode M20, and the lower gate electrode M10 may include metal. For example, the first electrode M31, the second electrode M32, the upper gate electrode M20, and the lower gate electrode M10 may be formed of one or more metals selected from aluminum (Al), platinum (Pt), palladium (Pd), silver (Ag), magnesium (Mg), gold (Au), nickel (Ni), neodymium (Nd), iridium (Ir), chromium (Cr), Nickel (Li), calcium (Ca), molybdenum (Mo), titanium (Ti), tungsten (W), copper (Cu), and may be formed as a single layer or multiple layers.

Figure 12:
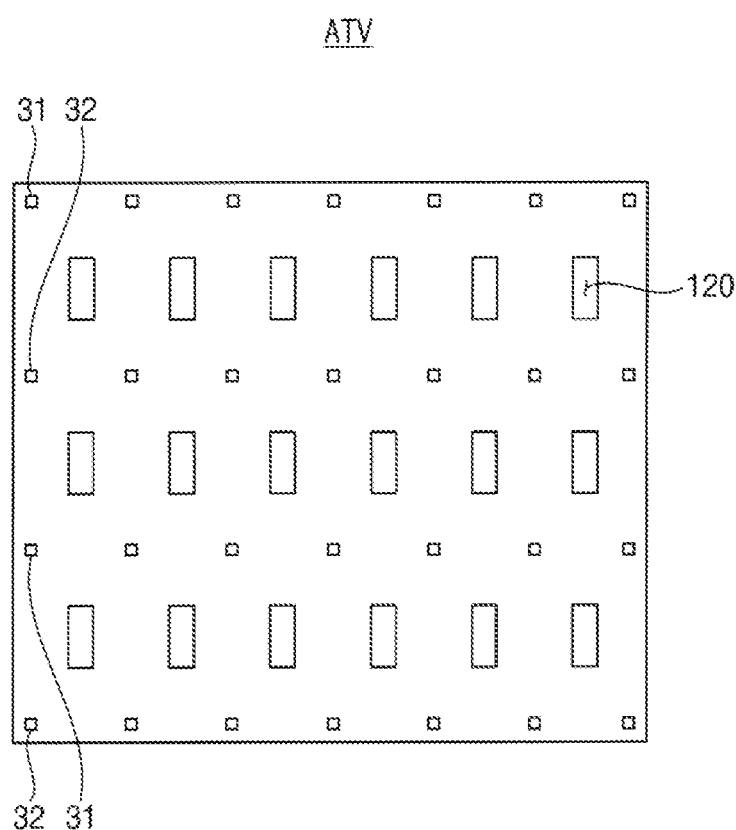

Referring to FIG. 12, the active layer ATV may include the first portion 31 and the second portion 32. The first portion 31 may contact the first electrode M31, and the second portion may contact the second electrode M32. The active layer ATV may include one or more openings 120. The openings 120 may overlap the upper gate electrode M20. The openings 120 may reduce heat generation of the active layer ATV. In embodiments, the active layer ATV may include an oxide semiconductor. In embodiments, the active layer ATV may include polysilicon including impurities.

Figure 13:
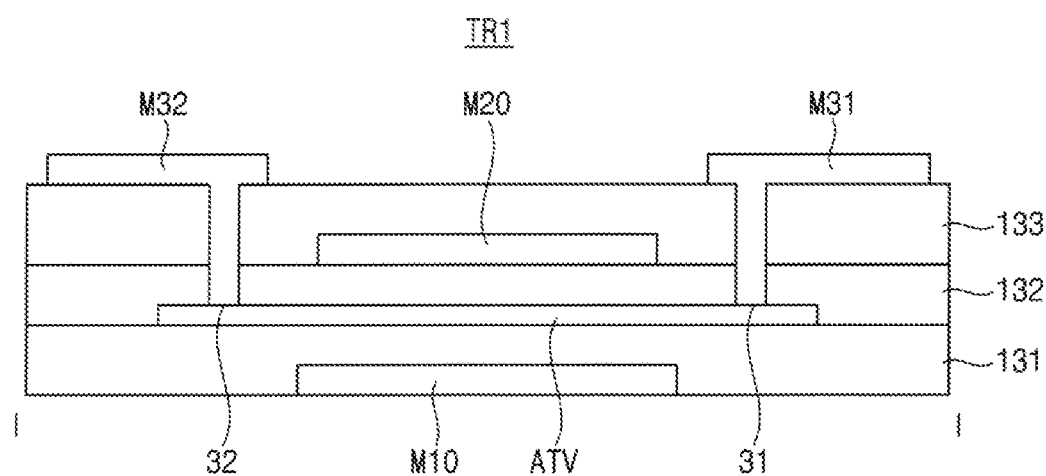
FIG. 13 is a cross-sectional view of the gate driving circuit in FIG. 8 taken along a line I-I'.

FIG. 13 is a cross-sectional view of the gate driving circuit of FIG. 8 taken along a line I-I'.

Referring to FIG. 13, the first transistor TR1 may include a lower gate insulating layer 131, a first insulating layer 132, and an upper gate insulating layer 133.

The lower gate insulating layer 131 may be disposed between the lower gate electrode M10 and the active layer ATV. The lower gate insulating layer 131 may electrically insulate the lower gate electrode M10 and the active layer ATV. The first insulating layer 132 may be disposed between the lower gate insulating layer 131 and the upper gate electrode M20 and may cover the active layer ATV. The first insulating layer 132 may electrically insulate the active layer ATV and the upper gate electrode M20.

The upper gate insulating layer 133 may be disposed on the first insulating layer 132 and may cover the upper gate electrode M20. The upper gate insulating layer 133 may electrically insulate the first electrode M31 and the second electrode M32 from the upper gate electrode M20.

The lower gate insulating layer 131, the first insulating layer 132, and the upper gate insulating layer 133 may include an insulating material. For example, each of the lower gate insulating layer 131, the first insulating layer 132, and the upper gate insulating layer 133 may include silicon oxide.

Figure 14:
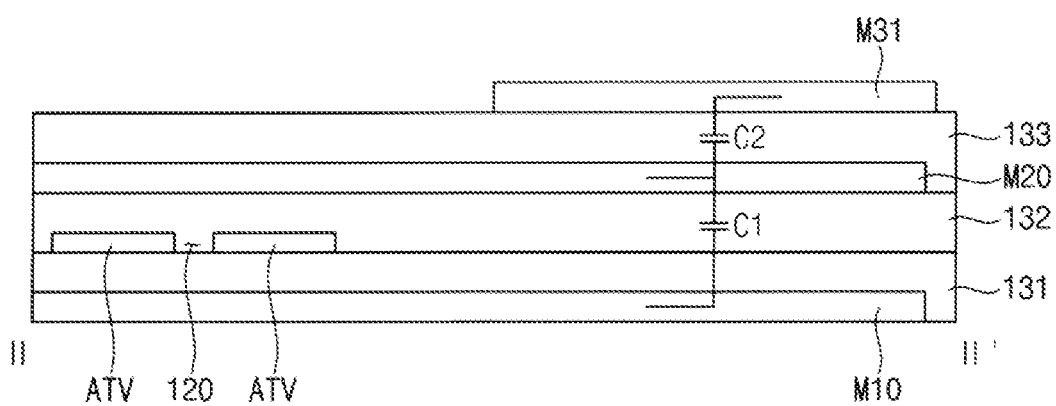
FIG. 14 is a cross-sectional view of the gate driving circuit in FIG. 8 taken along a line II-II'.

FIG. 14 is a cross-sectional view of the gate driving circuit of FIG. 8 taken along a is line II-II'.

Referring to FIG. 14, the first capacitor C1 may be defined as a region where the lower gate electrode M10 and the upper gate electrode M20 overlap (A111 of FIG. 11). The second capacitor C2 may be defined as a region where the first electrode M31 and the upper gate electrode M20 overlap (A102 of FIG. 10). The active layer ATV may include an opening 120 overlapping the upper gate electrode M20. The opening 120 may reduce heat generation of the active layer ATV.

The gate drivers constructed according to the principles and embodiments of the invention may be applied to a display device and an electronic device including the same. For example, they may be used in high-resolution smartphones, mobile phones, smart pads, smart watches, tablet PCs, vehicle navigation systems, televisions, computer monitors, etc.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A gate driving circuit for a display device, the gate driving circuit comprising:
    a plurality of unit stages connected to each other,
    wherein each of the plurality of unit stages comprises:
    a first transistor having a lower gate electrode, an upper gate electrode disposed on the lower gate electrode, an active layer disposed between the lower gate electrode and the upper gate electrode, a first electrode contacting a first portion of the active layer, and a second electrode contacting a second portion of the active layer;
    a first capacitor defined by a first region in which the lower gate electrode and the upper gate electrode overlap; and
    a second capacitor defined by a second region in which the upper gate electrode and the first electrode overlap,
    wherein the upper gate electrode and the lower gate electrode are electrically coupled to each other in the first region where the upper gate electrode and the lower gate electrode overlap to form the first capacitor,
    wherein the first transistor further comprises:
    a lower gate insulating layer disposed between the lower gate electrode and the active layer;
    a first insulating layer disposed between the lower gate insulating layer and the upper gate electrode and covering the active layer, the first insulating layer having a first opening and a second opening that extend from a top surface to a bottom surface of the first insulating layer, in which the first insulating layer covers an entirety of a top surface of the active layer except for where the first and second openings of the first insulating layer are disposed; and
    an upper gate insulating layer disposed on the first insulating layer and covering the upper gate electrode.

2. The gate driving circuit of claim 1, wherein the first electrode contacts the first portion of the active layer through the first opening in the first insulating layer and through an opening in the upper gate insulating layer, and the second electrode contacts the second portion of the active layer through the second opening in the first insulating layer and through an opening in the upper gate insulating layer.

3. The gate driving circuit of claim 2, wherein when a voltage at the upper gate electrode is a gate high voltage and a voltage at the second electrode changes from a gate low voltage to the gate high voltage,
    the second capacitor bootstraps the voltage at the upper gate electrode and a voltage at the first electrode.

4. The gate driving circuit of claim 1, wherein the first transistor is a PMOS transistor.

5. The gate driving circuit of claim 4, wherein when a voltage at the upper gate electrode is a gate low voltage and a voltage at the second electrode changes from a gate high voltage to the gate low voltage,
    the second capacitor bootstraps the voltage at the upper gate electrode and a voltage at the first electrode.

6. The gate driving circuit of claim 1, wherein the lower gate electrode and the upper gate electrode overlap each other in the first region.

7. The gate driving circuit of claim 1, wherein the active layer comprises an opening overlapping the upper gate electrode, the opening being from a top surface of the active layer to a bottom surface of the active layer.

8. The gate driving circuit of claim 1, wherein each of the plurality of the unit stages further comprises:
    a second transistor operable in response to a previous output signal from a previous unit stage;
    a third transistor to discharge the second capacitor in response to a next output signal from a next unit stage; and
    a fourth transistor to discharge a current output signal in response to the next output signal.

9. The gate driving circuit of claim 1, wherein the plurality of unit stages are connected to each other such that an output of a corresponding one of the plurality of unit stages is connected to an input of another of the plurality of unit stages that is adjacently positioned with respect to the corresponding one of the plurality of unit stages, and such that an output of the another of the plurality of unit stages is connected to an input of the corresponding one of the plurality of unit stages.

10. A display device, comprising:
    a substrate having a display area and a non-display area;
    a plurality of pixels in the display area; and
    a gate driving circuit in the non-display area,
    wherein the gate driving circuit comprises a plurality of unit stages connected to each other,
    wherein each of the plurality of unit stages comprises:
    a first transistor comprising a lower gate electrode, an upper gate electrode disposed on the lower gate electrode, an active layer disposed between the lower gate electrode and the upper gate electrode, a first electrode contacting a first portion of the active layer, and a second electrode contacting a second portion of the active layer;

a first capacitor defined by a first region in which the lower gate electrode and the upper gate electrode overlap; and a second capacitor defined by a second region in which the upper gate electrode and the first electrode overlap, wherein the upper gate electrode and the lower gate electrode are electrically coupled to each other in the first region where the upper gate electrode and the lower gate electrode overlap to form the first capacitor, wherein the active layer comprises an opening overlapping the upper gate electrode, the opening being from a top surface of the active layer to a bottom surface of the active layer.

11. The display device of claim 10, wherein the first electrode contacts the first portion of the active layer through the first opening in the first insulating layer and through an opening in the upper gate insulating layer, and the second electrode contacts the second portion of the active layer through the second opening in the first insulating layer and through an opening in the upper gate insulating layer.

12. The display device of claim 11, wherein when a voltage at the upper gate electrode is a gate high voltage and a voltage at the second electrode changes from a gate low voltage to the gate high voltage, the second capacitor bootstraps the voltage at the upper gate electrode and a voltage at the first electrode.

13. The display device of claim 10, wherein the first transistor is a PMOS transistor.

14. The display device of claim 13, wherein when a voltage at the upper gate electrode is a gate low voltage and a voltage at the second electrode changes from a gate high voltage to the gate low voltage, the second capacitor bootstraps the voltage at the upper gate electrode and a voltage at the first electrode.

15. The display device of claim 10, wherein the lower gate electrode and the upper gate electrode overlap each other in the first region.

16. The display device of claim 10, wherein the first transistor further comprises:

a lower gate insulating layer disposed between the lower gate electrode and the active layer;

a first insulating layer disposed between the lower gate insulating layer and the upper gate electrode and covering the active layer, the first insulating layer having a first opening and a second opening that extend from a top surface to a bottom surface of the first insulating layer, in which the first insulating layer covers an entirety of a top surface of the active layer except for where the first and second openings of the first insulating layer are disposed; and an upper gate insulating layer disposed on the first insulating layer and covering the upper gate electrode.

17. The display device of claim 10, wherein each of the plurality of the unit stages further comprises:

a second transistor operable in response to a previous output signal from a previous unit stage;

a third transistor to discharge the second capacitor in response to a next output signal from a next unit stage; and a fourth transistor to discharge a current output signal in response to the next output signal.

18. The display device of claim 10, wherein the plurality of unit stages are connected to each other such that an output of a corresponding one of the plurality of unit stages is connected to an input of another of the plurality of unit stages that is adjacently positioned with respect to the corresponding one of the plurality of unit stages, and such that an output of the another of the plurality of unit stages is connected to an input of the corresponding one of the plurality of unit stages.

* * * * *